(12) United States Patent
Schaeffer et al.

(10) Patent No.: US 6,656,605 B1
(45) Date of Patent: Dec. 2, 2003

(54) LOW-SULFUR ARTICLE COATED WITH A PLATINUM-GROUP METAL AND A CERAMIC LAYER, AND ITS PREPARATION

(75) Inventors: Jon C. Schaeffer, Milford, OH (US); Mark A. Rosenzweig, Hamilton, OH (US); Norman R. Lindblad, Cincinnati, OH (US); Wendy H. Murphy, Cincinnati, OH (US)

(73) Assignee: General Electric Company, Cincinnati, OH (US)

( * ) Notice: Subject to any disclaimer, the term of this patent is extended or adjusted under 35 U.S.C. 154(b) by 0 days.

(21) Appl. No.: 08/398,259

(22) Filed: Mar. 3, 1995

Related U.S. Application Data

(63) Continuation-in-part of application No. 07/960,494, filed on Oct. 13, 1992, now Pat. No. 5,538,796.

(51) Int. Cl.[7] .............................................. B21D 39/00
(52) U.S. Cl. ..................... 428/621; 428/670; 427/404; 427/419.2
(58) Field of Search .............................. 427/404, 419.2; 428/621, 670

(56) References Cited

U.S. PATENT DOCUMENTS

| | | | |
|---|---|---|---|
| 2,246,162 A | 6/1941 | Benjamin | 250/27.5 |
| 2,763,584 A | 9/1956 | Badger | 148/32 |
| 3,819,338 A | 6/1974 | Bungardt et al. | 29/194 |
| 3,853,540 A | * 12/1974 | Schlatter et al. | 75/53 |
| 3,979,273 A | 9/1976 | Panzera et al. | 204/192 |
| 4,328,285 A | * 5/1982 | Siemers et al. | 428/633 |
| 4,399,199 A | 8/1983 | McGill et al. | 428/633 |
| 4,477,538 A | 10/1984 | Clarke | 428/636 |
| 4,530,720 A | * 7/1985 | Moroishi et al. | 75/128 A |
| 4,626,408 A | * 12/1986 | Osozawa et al. | 420/442 |
| 4,895,201 A | * 1/1990 | DeCrescente et al. | 164/56.1 |
| 5,000,371 A | 3/1991 | Johnson | 228/193 |
| 5,270,123 A | 12/1993 | Walston et al. | 428/652 |
| 5,346,563 A | * 9/1994 | Allen et al. | 148/675 |
| 5,538,796 A | * 7/1996 | Schaffer et al. | 428/469 |

* cited by examiner

Primary Examiner—Benjamin L. Utech
(74) Attorney, Agent, or Firm—Andrew C. Hess; David L. Narciso

(57) ABSTRACT

A coated article is prepared by furnishing an article substrate having a free sulfur content of less than about 1 part per million. The low-sulfur article may be made of a material selected to have a low sulfur content, provided with a scavenging element that reacts with free sulfur to produce a sulfur compound, or desulfurized by contact with a reducing gas such as hydrogen. A platinum-group metal layer is deposited over the article substrate, and a ceramic coating is applied over the platinum-group metal layer.

16 Claims, 2 Drawing Sheets

LOW-SULFUR ARTICLE COATED WITH A PLATINUM-GROUP METAL AND A CERAMIC LAYER, AND ITS PREPARATION

This application is a continuation-in-part of application Ser. No. 07/960,494, filed Oct. 13, 1992, now U.S. Pat. No. 5,538,796.

BACKGROUND OF THE INVENTION

This invention relates to articles coated with an insulating ceramic barrier, and, more particularly, to such articles having a substrate, a platinum-group metal layer over the substrate, and a ceramic top coating.

In an aircraft gas turbine (jet) engine, air is drawn into the front of the engine, compressed by a shaft-mounted compressor, and mixed with fuel. The mixture is burned, and the hot exhaust gases are passed through a turbine mounted on the same shaft. The flow of gas turns the turbine, which turns the shaft and provides power to the compressor. The hot exhaust gases flow from the back of the engine, driving it and the aircraft forwardly.

The hotter the exhaust gases, the more efficient is the operation of the jet engine. There is thus an incentive to raise the exhaust combustion gas temperature. However, the maximum temperature of the combustion gases is normally limited by the materials used to fabricate the turbine vanes and turbine blades of the turbine, upon which the combustion gases impinge when they are at their hottest temperatures. In current engines, the turbine vanes and blades are made of nickel-based superalloys, and can operate at temperatures of up to 1900–2100 F.

Many approaches have been used to increase the operating temperature limit of the turbine blades and vanes to their current levels. The composition and processing of the materials themselves have been improved, and physical cooling techniques are employed.

In another approach, a thermal barrier coating system is applied to the turbine blade or turbine vane component, which serves as a substrate. The thermal barrier coating system includes a ceramic thermal barrier coating that insulates the component from the hot exhaust gas, permitting the exhaust gas to be hotter than would otherwise be possible with the particular material and fabrication process of the component. An additional metallic layer called a bond coat is placed between the substrate and the thermal barrier coating to aid in adhering the ceramic thermal barrier coating to the substrate and to protect the substrate against contact with the exhaust gases and against oxidation.

In a variation of this approach, it is known to use a layer of platinum or other platinum-group metal instead of the bond coat, between the substrate and the thermal barrier coating. Such a structure has several advantages, including reduced interdiffusion between the bond coat and the substrate, enhanced formation and sustainability of a protective aluminum scale on the substrate, reduced cost, and maintainability of substrate mechanical properties. However, there remains opportunity for improvement of protective systems using a layer of a platinum-group metal and a ceramic thermal barrier coating. For example, spallation of the protective system can occur during operation of the protected component in extreme environments such as that of a gas turbine, leading to failure of the protective system.

There is an ongoing need for improved protected superalloy articles, and methods for their preparation, which attain long operating lives at elevated temperatures. The present invention fulfills this need, and further provides related advantages.

SUMMARY OF THE INVENTION

The present invention provides a method for preparing an article protected by a ceramic layer, and the article itself. The articles are operable at high temperatures because of the presence of an adherent thermal barrier coating, and have excellent resistance to spallation loss of the thermal barrier coating during repeated heating and cooling cycles such as those experienced in a gas turbine engine. The components are also resistant to degradation by environmental attack. These advantages are obtained even though the conventional bond coat is omitted. In one embodiment, the approach of the invention permits the rare earth/yttrium content of the substrate to be reduced or eliminated.

In accordance with the invention, a method for preparing a coated article comprises the steps of furnishing an article substrate, preferably a nickel-base superalloy, having a free sulfur content of less than about 1 part per million. The method further includes depositing a platinum-group metal layer over the article substrate, and applying a ceramic coating over the platinum-group metal layer.

The substrate article with low free sulfur content can be furnished in a variety of ways. The base metal can be selected to have a low free sulfur content. The composition of the base metal can be modified to result in a low free sulfur content. In one approach, a sulfur-scavenging element such as yttrium, hafnium, or zirconium is provided in the base metal in an amount sufficient to reduce the free sulfur content to less than about 1 part per million (ppm).

In another approach, a conventional high-sulfur base metal can be provided. The base metal is contacted to a reducing gas to remove the total, and thence free, sulfur to the required low level. For example, the base metal can be contacted at elevated temperatures to hydrogen or a hydrogen-containing gas that desulfurizes the metal.

The layer of platinum-group metal, preferably platinum, is deposited over the substrate having low free sulfur content. The layer is preferably from about 2 to about 10 micrometers thick, most preferably from about 4 to about 10 micrometers thick. The ceramic coating, preferably yttria-stabilized zirconia, is deposited over the layer of platinum-group metal. Both the layer of platinum-group metal and the ceramic coating are also low in sulfur, preferably less than 1 ppm.

The adverse consequences of a high sulfur content upon a protective system having a layer of a platinum-group metal and a ceramic coating have not been previously recognized. Consequently, in many instances the sulfur content of the underlying substrate upon which the protective system is deposited has not been reported. It may not be concluded from the absence of reporting of the sulfur content that the sulfur content is zero or otherwise less than about 1 part per million. Instead, in such situations it may be concluded that the sulfur content is likely in the typical range of about 5 to about 30 parts per million by weight, and that the sulfur content was not reported because there was no realization of its significance in this low concentration range.

The coated article of this type can be used in high-temperature applications in severe environments. A preferred application is as a gas turbine blade or vane, but the invention is not so limited. Other features and advantages of the present invention will be apparent from the following more detailed description of the preferred embodiment, taken in conjunction with the accompanying drawings, which illustrate, by way of example, the principles of the invention.

DETAILED DESCRIPTION OF THE INVENTION

Figure 1:
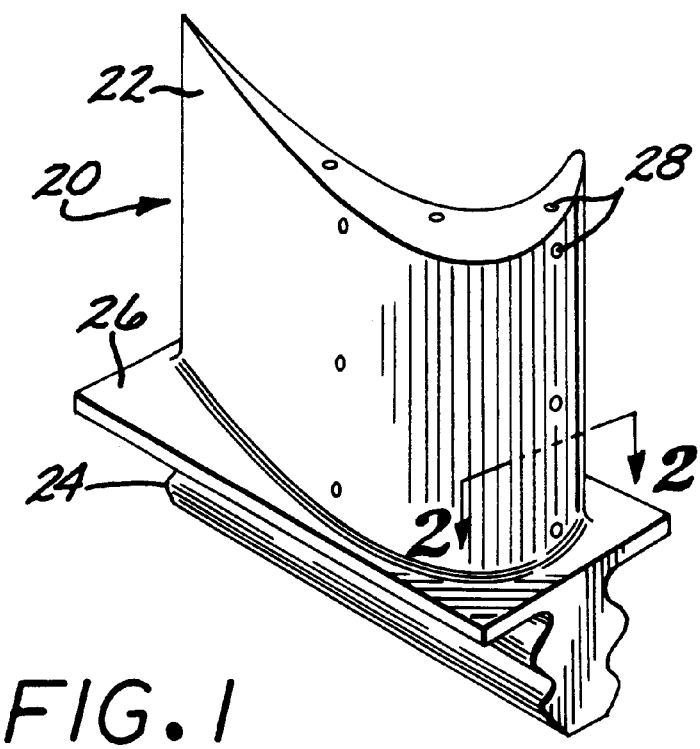
FIG. 1 is a perspective view of a gas turbine article.

FIG. 1 depicts a component of a gas turbine engine such as a turbine blade or turbine vane, and in this case is depicted as a turbine blade 20. Other components can benefit from the coating approach of the invention, such as, for example, combustor liners, turbine seals, exhaust nozzles, and shrouds. The turbine blade 20 includes an airfoil 22 against which the flow of hot exhaust gas is directed. The turbine blade 20 is mounted to a turbine disk (not shown) by a dovetail 24 which extends downwardly from the airfoil 22 and engages a slot on the turbine disk. A platform 26 extends longitudinally outwardly from the area where the airfoil 22 is joined to the dovetail 24. A number of cooling channels desirably extend through the interior of the airfoil 22, ending in openings 28 in the surface of the airfoil 22. A flow of cooling air is directed through the cooling channels, to reduce the temperature of the airfoil 22.

Figure 2:
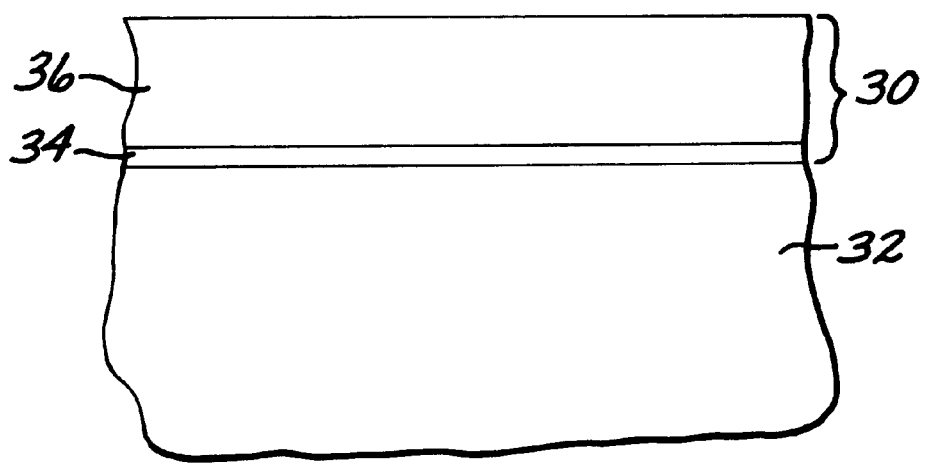
FIG. 2 is a sectional view through the article of FIG. 1, taken generally along line 2—2, illustrating a protective coating system on the surface of the article.

FIG. 2 illustrates a protective system 30 deposited upon the turbine blade 20, which thereby acts as a substrate 32. The substrate 32 may be formed of any operable material, but a preferred base metal from which the article substrate is formed is a nickel-base superalloy. A preferred superalloy is Rene N5, which has a nominal composition in weight percent of 7.5 percent cobalt, 7 percent chromium, 6.2 percent aluminum, 6.5 percent tantalum, 5 percent tungsten, 1.5 percent molybdenum, 3 percent rhenium, balance nickel. The substrate 32 has a sulfur content of less than about 1 part per million (ppm), and preferably on the order of about 0.2 parts per million. Larger amounts of sulfur interfere with the adherence of coatings to the surface of the substrate during service. The sulfur content need meet this requirement only locally, near the surface of the substrate 32. Because sulfur diffuses through the substrate during elevated temperature exposure, it is, however, preferred that the sulfur content be below about 1 ppm throughout at least most of, and most preferably all, the substrate material.

The protective system 30 includes a layer 34 of a platinum-group metal deposited upon the substrate 32. The layer 34 is preferably from about 2 to about 10 micrometers in thickness. Lesser thicknesses of the layer 34 tend to have small paths or passageways therethrough. Greater thicknesses of the layer 34 are expensive and exhibit an increased tendency to separate from the substrate 32 during processing and/or service. The layer 34 is preferably made of platinum, but may be another platinum-group metal such as palladium, rhodium, or iridium, or an alloy of two or more of these noble metals.

The protective system 30 further includes a ceramic coating 36 deposited upon the layer 34 of the platinum-group metal. The coating 36 is preferably from about 0.004 inches to about 0.025 inches thick, most preferably from about 0.005 to about 0.015 inches thick. (FIG. 2 is not drawn to scale.) Lesser thicknesses of the coating 36 give insufficient insulation to the substrate 32. Greater thicknesses of the coating 36 tend to separate from the article during service, particularly following thermal cycling of the article. The coating 36 is preferably yttria-stabilized zirconia, which is zirconium oxide containing from about 6 to about 8 weight percent of yttrium oxide. Other operable ceramic materials may be used as well.

Protective systems of this general type are known in the art, except that the virtues of a low-sulfur substrate were not recognized. See, for example, U.S. Pat. No. 4,399,199, whose disclosure is incorporated by reference.

Figure 3:
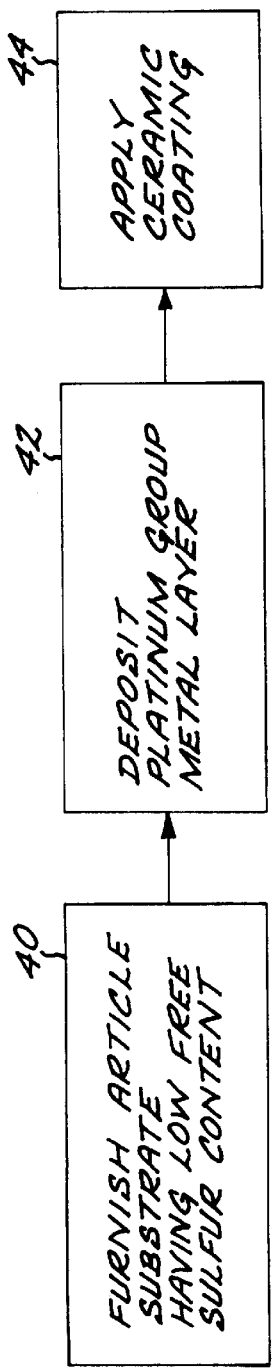
FIG. 3 is a block diagram of one embodiment of the approach of the invention.

FIG. 3 depicts a method of preparing a coated article such as the turbine blade 20. An article substrate having a free sulfur content of less than about 1 part per million (ppm), preferably about 0.2 parts per million, is furnished, numeral 40. The article substrate has the shape of the final desired coated article, with the same dimensions reduced only by an allowance for the thickness of the protective system. In the case depicted in FIG. 1, the article substrate would have the shape of the turbine blade 20. In a typical commercial operation, the base metal would be melted and then formed into the shape of the article substrate by directional solidification to produce an oriented microstructure in the article substrate.

As used herein, "free sulfur" is sulfur present in elemental form and not chemically combined with another element. Free sulfur is to be contrasted with combined sulfur, in which the sulfur is chemically combined with one or more other elements. The total sulfur content is the free sulfur content plus the combined sulfur content. The important distinction between free sulfur and combined sulfur, for the present purposes, is that free sulfur can diffuse to the surface of the substrate and aid in the debonding of the protective system 30 from the substrate. Combined sulfur, on the other hand, is fixed at a single location and cannot move to the surface of the article.

The article substrate having a free sulfur content below about 1 part per million can be achieved in several ways. In one, only those heats of material having such a sulfur content would be selected and used to fabricate the article substrate. This approach is expected to have limited usefulness, because most alloys tend to have larger amounts of sulfur present due to their method of melting and casting.

In another approach, a scavenger element that reacts with free sulfur to produce combined sulfur could be present in the base metal which is used to make the article substrate. The scavenger element must be present in a sufficient amount to reduce the remaining free sulfur—that sulfur which does not react to produce combined sulfur—to the required low level of less than about 1 part per million. The scavenger element is preferably yttrium, hafnium, or zirconium, each of which reacts with free sulfur to produce a metal sulfide. As an example, if the free sulfur is initially on the order of about 20 parts per million, then yttrium as a scavenger element would necessarily be present in an amount of at least about 100 parts per million in order to reduce the free sulfur to less than about 1 part per million. The required amount of the scavenger element cannot be stated quantitatively as an absolute minimum content, because the initial sulfur content can vary.

In another, preferred approach, the article substrate is made of a base metal having a free sulfur content of more than about 1 part per million. The article substrate is thereafter processed to reduce its sulfur content to less than about 1 part per million. The preferred processing is achieved by contacting the article substrate to a reducing gas at elevated temperature. The reducing gas reduces and reacts with the sulfur at the surface of the article substrate to produce a gaseous sulfide which is carried away into the gaseous atmosphere. Any native dense oxide present at the surface of the substrate must not act as a barrier to sulfur removal in this process. If any such barrier is present, it must be removed prior to the sulfur-removal treatment. Sulfur that is initially within the interior of the article substrate diffuses to the surface, and is in turn reduced and reacted to remove it from the substrate. The process is continued until the sulfur content of the article substrate is reduced to the required level.

The sulfur in the article substrate is reduced to less than 1 ppm, and most preferably to about 0.1–0.2 ppm, by the desulfurization treatment. Desulfurization is achieved by heating the article substrate 32 in a reducing atmosphere, preferably 1 atmosphere of flowing hydrogen gas or other hydrogen-containing gas, to a high temperature for a period of time sufficient to react and remove the sulfur from the substrate. For nickel-base superalloys, the desulfurization heat treatment temperature is conducted at at least about 2200° F., to achieve the required degree of desulfurization in a commercially acceptable time. The temperature to which the substrate is heated will depend upon the composition of the substrate. For the preferred Rene N5 substrate, a temperature of about 2250–2340° F. is preferred. For an actual substrate in the form of a turbine blade airfoil, desulfurization was successfully completed by exposure to 1 atmosphere of flowing hydrogen gas at 2336° F. in a time of 100 hours.

The desulfurization treatment, when used, is conducted after the casting of the base metal to form the article substrate, and before the deposition of the protective system 30. Equivalently, the base metal may be desulfurized and thereafter formed into the shape of the article substrate. The latter approach is not preferred, inasmuch as sulfur may be re-introduced into the metal during the fabrication of the article substrate to an unacceptably high level. If the metal is desulfurized prior to forming the article substrate, care must be taken so that sulfur is not re-introduced when the article substrate is formed.

The described gaseous desulfurization approach is the preferred technique of furnishing the article substrate have a free sulfur content of less than about 1 part per million. Selecting article substrates that naturally have less than about 1 part per million of free sulfur would not be commercially feasible, because superalloy melting techniques typically result in from about 5 to about 30 parts per million of sulfur in the superalloy. The use of scavenger elements to reduce the sulfur content is viable but such elements may have other, undesirable effects when present in the superalloy. The presence of some scavenger elements, notably yttrium and hafnium, also complicate the melting and casting of the base metal due to chemical reactions with common crucible and mold materials. Other ladle metallurgical techniques may be possible to reduce the sulfur content to the desired levels.

The layer 34 of the platinum-group metal is deposited onto the surface of the article substrate 32, numeral 42. In the case of the preferred platinum layer 34, deposition is accomplished by electroplating the platinum onto the surface to the desired thickness. The substrate 32 and electroplated platinum layer 34 are thereafter desirably heated to cause the platinum to interdiffuse into the substrate by a small amount. Other methods of Pt deposition are sputtering, ion plating and metallo-organic chemical vapor deposition (CVD). A preferred interdiffusion treatment is at a temperature of about 1700–1975° F. for a time of about 2 hours in vacuum, hydrogen atmosphere, or argon atmosphere. The interdiffusion treatment can be conducted separately, or as a part of another processing step such as the ceramic application step, discussed next.

The ceramic coating 36 is applied over the layer 34 of platinum-group metal, numeral 44 of FIG. 3. The ceramic coating 36 may be deposited by any operable technique, with electron beam physical vapor deposition (EBPVD) being preferred. Other techniques include air plasma spray and low pressure plasma spray. The protective system 30 is now complete.

Figure 4:
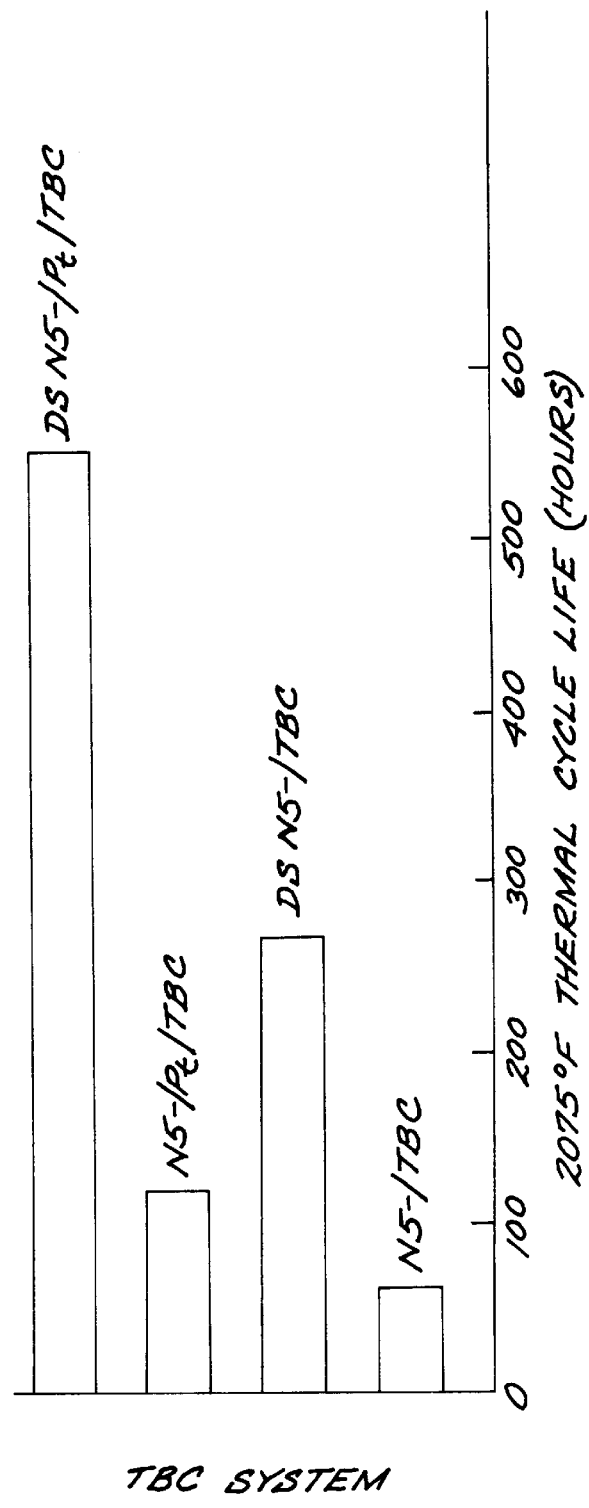
FIG. 4 is a graph illustrating the operating life of various coated articles in a test simulating a gas turbine environment.

The approach of FIG. 3, using the preferred desulfurization in gaseous hydrogen to prepare the substrate, has been practiced using test specimens made of a Rene N5 article substrate without acavenger elements. The test specimens were disks 1 inch in diameter and ⅛ inch thick. For comparison purposes, other protective systems were prepared and tested. The results of testing are depicted in FIG. 4.

Three specimens made according to the present invention were prepared by desulfurizing the Rene N5 with no scavenger elements to a free sulfur content of about 0.2 parts per million. A layer 34 of platinum about 5 micrometers thick was deposited by electroplating. The platinum was interdiffused at 1700° F. for 2 hours in a hydrogen atmosphere. A ceramic coating of yttria-stabilized zirconia about 0.005 inches thick was deposited by electron beam physical vapor deposition. These specimens are indicated as DSN5-/Pt/TB3C in FIG. 4.

One first comparison specimen was prepared with Rene N5 with no scavenger elements that had a sulfur content of about 30 parts per million, and which was not desulfurized. A layer 34 of platinum about 5 micrometers thick was deposited by electroplating. The platinum was interdiffused at 1700° F. for 2 hours in a hydrogen atmosphere. A ceramic coating of yttria-stabilized zirconia about 0.005 inches thick was deposited by electron beam physical vapor deposition. These specimens are indicated as N5/Pt/TBC in FIG. 4.

Three second comparison specimens were prepared by desulfurizing the Rene N5 with no scavenger elements to a free sulfur content of about 0.2 parts per million. No platinum or other type of metallic layer was deposited over the substrate. A ceramic coating of yttria-stabilized zirconia about 0.005 inches thick was deposited by electron beam physical vapor deposition. These specimens are indicated as N5/TBC in FIG. 4.

One third comparison specimen was prepared with Rene N5 that had a sulfur content of about 30 parts per million, no scavenger elements, and which was not desulfurized. A ceramic coating of yttria-stabilized zirconia about 0.005 inches thick was deposited by electron beam physical vapor deposition. These specimens are indicated as N5/TBC in FIG. 4.

These specimens were all tested by thermally cycling once per hour from ambient temperature to 2075° F. until spallation of the ceramic layer was observed.

FIG. 4 depicts the results in terms of the life of the protective system prior to spallation. The approach of the invention achieves an improvement of a factor of 2–3 over any of the other specimens tested. These results are particularly surprising and unexpected in view of the absence of aluminum in the layer 34 to form a protective aluminum oxide layer at the surface of the article substrate. However, the platinum in the layer 34 causes the rapid selective oxidation of the aluminum in the N5 substrate alloy. The low sulfur content of the low sulfur N5 substrate material is believed to contribute to the good adherence of the ceramic layer to the substrate.

This invention has been described in connection with specific embodiments and examples. However, it will be readily recognized by those skilled in the art the various modifications and variations of which the present invention is capable without departing from its scope as represented by the appended claims.

What is claimed is:

1. A method for preparing a coated article, comprising the steps of:

furnishing an article substrate formed of a nickel-based superalloy and having a free sulfur content of less than about 1 part per million; depositing a layer of a platinum-group metal over the article substrate; and applying a ceramic coating over the layer of a platinum-group metal.

2. The method of claim 1, wherein the step of furnishing includes the step of fabricating the article substrate from a material having a free sulfur content of less than about 1 part per million.

3. The method of claim 1, wherein the step of furnishing includes the step of fabricating the article substrate from a material comprising a scavenger element that is reactive with free sulfur to form a sulfur-containing compound, the scavenger element being present in an amount sufficient to reduce a residual free sulfur content of the article substrate to less than about 1 part per million.

4. The method of claim 3, wherein the step of furnishing includes the step of providing as the scavenger element an element selected from the group consisting of yttrium, hafnium, and zirconium.

5. The method of claim 1, wherein the step of depositing includes the step of depositing a layer of platinum over the article substrate.

6. The method of claim 1, wherein the step of depositing includes the step of depositing the layer of platinum-group metal to a thickness of from about 2 to about 10 micrometers over the article substrate.

7. The method of claim 1, wherein the step of applying includes the step of applying a coating comprising yttria-stabilized zirconia over the layer of the platinum-group metal.

8. The method of claim 1, wherein the step of furnishing includes the step of furnishing an article substrate which is a component of a gas turbine engine.

9. A coated article made by the process of claim 1.

10. A method for preparing a coated article, comprising the steps of:

furnishing an article substrate having a free sulfur content of less than about 1 part per million, wherein the step of furnishing includes the step of providing the article substrate having more than about 1 part per million of free sulfur, and processing the article substrate to reduce the free sulfur level to less than about 1 part per million, wherein the step of processing includes the step of contacting the article substrate to a reducing gas at elevated temperature;

depositing a layer of a platinum-group metal over the article substrate; and applying a ceramic coating over the layer of a platinum-group metal.

11. The method of claim 10, wherein the step of contacting includes the step of contacting the article substrate to a hydrogen-containing gas at elevated temperature.

12. A method for preparing a coated article, comprising the steps of:

furnishing an article substrate made of a nickel-base superalloy and having a local free sulfur content of less than about 1 part per million in a selected region;

depositing a platinum-group metal layer over the selected region of the article substrate; and applying a ceramic coating over the platinum-group metal layer in the selected region of the article substrate.

13. A coated article made by the process of claim 12.

14. The method of claim 12, wherein the step of furnishing an article substrate includes the step of furnishing an article substrate which is a component of a gas turbine engine.

15. A coated article, comprising:

an article substrate comprising a nickel-base superalloy and having a sulfur content of less than about 1 part per million;

a platinum-group metal layer overlying the article substrate; and a ceramic coating overlying the platinum-group metal layer.

16. The article of claim 15, wherein the article substrate is a component of a gas turbine engine.

* * * * *